United States Patent
Barnes

(10) Patent No.: US 7,017,131 B2
(45) Date of Patent: Mar. 21, 2006

(54) CELL REPLACEMENT ALGORITHM

(75) Inventor: Paul Barnes, Tintern (GB)

(73) Assignee: STMicroelectronics Limited, (GB)

(*) Notice: Subject to any disclaimer, the term of this patent is extended or adjusted under 35 U.S.C. 154(b) by 123 days.

(21) Appl. No.: 10/614,336

(22) Filed: Jul. 7, 2003

(65) Prior Publication Data

US 2005/0010889 A1    Jan. 13, 2005

(51) Int. Cl.
    *G06F 17/50* (2006.01)
(52) U.S. Cl. ............................................. 716/6; 716/5
(58) Field of Classification Search ................ 716/1–2, 716/4–6, 8–11
See application file for complete search history.

(56) References Cited

U.S. PATENT DOCUMENTS

| | | | |
|---|---|---|---|
| 6,272,668 B1 * | 8/2001 | Teene ............................ | 716/10 |
| 6,427,226 B1 * | 7/2002 | Mallick et al. ................ | 716/10 |
| 6,493,856 B1 * | 12/2002 | Usami et al. .................. | 716/10 |

* cited by examiner

Primary Examiner—Vuthe Siek

(57) ABSTRACT

A method of replacing standard cells with high speed cells in the design of a circuit using a computer program, said application specific integrated circuit design comprising a plurality of high speed cells and a plurality of standard cells, said high speed cells and standard cells being arranged to form a plurality of paths on said application specific integrated circuit, said method comprising the steps of: timing said plurality of paths identifying cells occurring on paths for which timing targets are not met; upgrading at least one of said identified cells to a high speed cell.

38 Claims, 1 Drawing Sheet

CELL REPLACEMENT ALGORITHM

FIELD OF THE INVENTION

The present invention relates to the design of an application specific integrated circuit (ASIC). In particular the present invention relates to the use of an algorithm in the design process of an ASIC.

BACKGROUND OF THE INVENTION

The design of an ASIC involves selecting cells from an ASIC library to implement the function of a circuit. Typically, each cell in the library is either a standard cell (LL) which operates at a relatively low speed, or a high speed cell (HS) which operates at a relatively high speed. Standard cells and high speed cells may be used in combination in the design of an ASIC. A high speed cell is constructed of low transistors.

To achieve performance gain high speed (HS) cells are partially on, even when there is no activity on the cell. This requires a static or 'leakage' current to be drawn. HS cells therefore consume more power than LL cells. It is therefore necessary to include an optimum number of HS cells such that the performance requirements of the circuit are met without exceeding the power goals of the circuit.

The speed at which an ASIC runs may be calculated using Static Timing Analysis (STA). STA calculates the speed of the ASIC using the characteristics of the cells incorporated in the design of the ASIC together with the resistance and capacitance of the wires that physically connect the cells.

A method currently used to optimise the number of HS cells in the design of an ASIC is to use a logic synthesis tool. A logic synthesis tool may select LL and HS cells during the synthesis of the design of an ASIC. The decision to use either an LL cell or an HS cell is based on a statistical estimate of the wire length used in the ASIC design. By estimating the wire length, the resistance and capacitance of the wires may be calculated which may then be used in Static Timing Analysis.

A disadvantage of allowing the logic synthesis tool to freely incorporate HS cells into the design of an ASIC, is that this may cause the synthesis tool to construct lower area or 'slower' architectures and to recover the area using HS cells. This can give a false impression of the true size of a design. A further disadvantage is that synthesis tools may fully populate long critical paths with HS cells where ideally the designer needs to add pipelining, thereby masking fundamental design issues.

Another method currently used to optimise the number of HS cells in an ASIC is to allow a placement tool to use both LL and HS cells. In this method the actual physical locations of the cells are determined and it is assumed that cells are connected with wires that have minimum horizontal and vertical distance in order to calculate the wire length. This is known as Steiner routing. A percentage error is added to the calculated length of wire in order to include an allowance for deviations from the minimum path of a wire.

A disadvantage of this method is that the percentage error that is added to the calculated wire length is often an over estimate. This results in the placement tool including more HS cells in the design of the ASIC than is actually needed.

Post route HS optimisation is a method of adjusting the number of HS cells after detailed routing of the ASIC has been completed. Post route HS optimisation involves some form of analysis to determine whether maximum transition times or maximum delay targets are met. Post route optimisation may therefore be used to adjust the number of HS cells after a placement tool has been used to incorporate HS and LL cells.

The advantage of adjusting the HS cells at this stage of the design of the circuit is that routing is not disturbed. The effect of changing the reference of a cell, for example from HS to LL may simply be tested by re-running STA.

Changing the reference of a cell during post route optimisation is carried out on a manual ad hoc basis. The cells that are changed are chosen by manual inspection of timing reports generated by STA. Current methods of post route HS optimisation are therefore extremely time consuming. Furthermore the degree to which the optimisation is performed is subject to manual error.

It is therefore an aim of embodiments of the present invention to overcome the above mentioned disadvantages by providing a method for optimising the use of HS cells to maximise the likelihood of meeting timing and power budgets.

STATEMENT OF INVENTION

According to a first aspect of the present invention there is provided a method of replacing standard cells with high speed cells in the design of a circuit using a computer program, said application specific integrated circuit design comprising a plurality of high speed cells and a plurality of standard cells, said high speed cells and standard cells being arranged to form a plurality of paths on said application specific integrated circuit, said method comprising the steps of timing said plurality of paths identifying cells occurring on paths for which timing targets are not met; upgrading at least one of said identified cells to a high speed cell.

According to a second aspect of the present invention there is provided a computer programme for replacing standard cells with high speed cells in the design of a circuit, said application specific integrated circuit design comprising a plurality of high speed cells and a plurality standard cells, said high speed cells and standard cells being arranged to form a plurality of paths on said application specific integrated circuit, said computer program arranged to carry out the steps of: timing said plurality of paths; identifying cells occurring on paths for which timing targets are not met; upgrading at least one of said identified cells to a high speed cell.

BRIEF DESCRIPTION OF DRAWINGS

Embodiments of the present invention will now be described by way of example only with reference to the accompanying drawings, in which.

DETAILED DESCRIPTION OF EMBODIMENTS OF THE INVENTION

Figure 1:
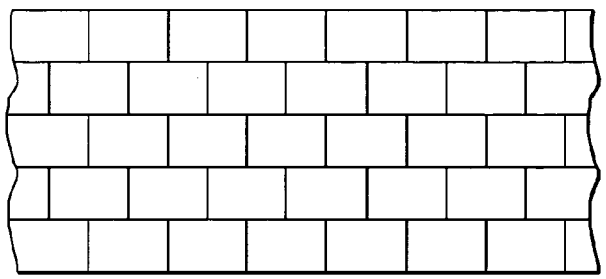
FIG. 1 is a diagram of an array of cells.

Reference is first made to FIG. 1. FIG. 1 shows an application specific integrated circuit (ASIC) as a tiled array of cells (2). Each of the cells in the array are logic cells, that each perform a particular function. As described previously, a cell may either be a standard cell (LL), or a high speed cell (HS).

Wires (not shown) physically connect cells together to form a plurality, of paths. One cell may be common to a number of paths, whereas another cell may only be included in one path. Upgrading cells that are common to a number of paths to HS cells is desirable as this will provide a large performance gain with only a small increase in the power requirements of the circuit.

In preferred embodiments of the invention, for every LL cell in the library there is an equivalent HS cell with identical physical dimensions. Since the cells with equivalent functions are the same size, an LL cell may be replaced by an HS cell without altering the wiring between the cells or the structure of the array. In alternative embodiments of the invention the dimensions of the cells may differ.

Figure 2:
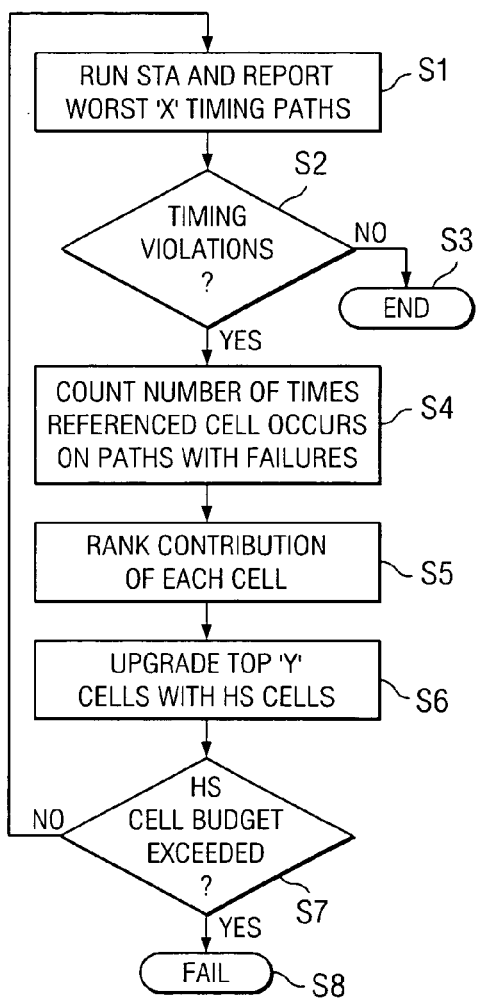
FIG. 2 is a flow chart showing a method in accordance with an embodiment of the present invention.

A preferred embodiment of the invention will now be described with reference to FIG. 2. FIG. 2 is a flow chart showing the steps of an algorithm to be run on a computer, in accordance with a preferred embodiment of the present invention.

In step 1 (S1) of the algorithm static timing analysis (STA) is performed on all paths and a predetermined number of the slowest paths are reported. A path may be defined by an end point, i.e. the cell at which the path terminates. In one embodiment of the present invention STA is set to identify one path for each endpoint, such that if there is more than one path per endpoint, the path with the worst timing is reported. A predetermined number (x) of slowest paths identified in STA are reported. In a preferred embodiment of the present invention the predetermined number of paths (x) reported may be preset in a program, for example as 500, and may be included in the program as follows:

set number of paths to report setenv MAX_REP 500                                              (A1)

(See Annex A)

Alternatively the predetermined number of paths (x) may be entered by the user while running the algorithm on a computer. In a further alternative embodiment of the invention the predetermined number of paths reported may be stored in an input file stored on the computer and read during the process.

At step 2 (S2), it is determined whether the timing of any of the paths that were reported at step 1 exceed a maximum time allowed for the timing of a path. In a preferred embodiment of the present invention the specified maximum time allowed is fixed. If no timing violations have occurred the process is ended at step 3.

If it is determined that the timing of any of the paths reported at step 1 exceed the maximum time, the process continues to step 4 (S4). At step 4 the paths that exceed the maximum time are analysed. The total number of times that a particular referenced cell occurs on the paths that exceed the maximum time is counted.

At step 5 the cells that were counted in step 4 are ranked in order of the contribution of the cell to the overall timing miss, such that the cell with the highest contribution to the overall timing miss is allocated the rank number '1'. The manner in which the cells may be ranked will be discussed in detail hereinafter.

At step 6 a predetermined number (y) of the most highly ranked cells are upgraded to HS cells. The predetermined number (y) of cells that are upgraded may be preset in the algorithm and for example may be preset to be the same as the number (x) of paths that were reported at step 1. The predetermined number (y) of cells that are upgraded may thus be defined in the algorithm as:

limit the number of cell substitutions per pass set cells_per_pass=$MAX_REP                                     (A2)

(See Annex A)

Alternatively the predetermined number of cells (y) that are upgraded may be entered by the user while running the algorithm on the computer. In a further alternative embodiment of the invention the predetermined number (y) of upgraded cells may be stored in an input file stored on the computer and read during the process.

In practice, the maximum number of HS cells in an ASIC is approximately 5–10% of the total number of cells. It is therefore desirable to set the number (y) of cells to be upgraded to HS cells to approximately 1% of the total number of cells in order to approach the maximum number of HS cells in steps.

In step 7 it is determined whether the HS cell limit has been exceeded. The HS cell limit is the maximum number of HS cells permitted in the design of an ASIC. In a preferred embodiment of the present invention the number of HS cells used in an ASIC is limited to 10% of the total number of cells however this will depend on the design of the ASIC.

If it is determined that the HS cell limit has been exceeded the process ends at step 8 (S8) and the process is held to have failed. The process could then be restarted with different values for x and y. If no improvement can be found the timing requirements of the design cannot be met without more interventionist techniques which would disturb the routing and/or cell placement. Otherwise, if the HS limit has not been exceeded the process returns to step 1 and is repeated (see Annex B).

In one embodiment of the present invention the above algorithm may be applied to all of the paths included in the ASIC during one pass of the algorithm.

In a preferred alternative embodiment of the invention, the algorithm may be applied to different 'path groups'. These groups may be categorised as: the sections of paths that run between an input and the first register on a path, the sections of paths that run between the first register and the last register on a path; and the sections of paths that run between the last register and the output on a path. These categories may be referred to as 'input to flop', 'flop to flop' and 'flop to output' respectively.

Categorising sections of paths into different path groups allows a different 'maximum time' to be set in step 2 of the algorithm for each path group. Therefore performing the algorithm separately on each path group allows sections of the paths to be analysed using a different 'maximum time' criteria, thus allowing the design of a section of a path to be optimised.

As previously described, paths that violate the maximum time allowed for the timing of path, are identified at step 2 of the algorithm, and at step 4 the number of times a particular referenced cell occurs on the violating paths is assessed. The ranking process of step 5 uses the information determined at step 4 to determine which cells should be replaced with HS cells. A method used in a preferred embodiment of the present invention for the ranking process of step 5 will now be described.

Figure 3:
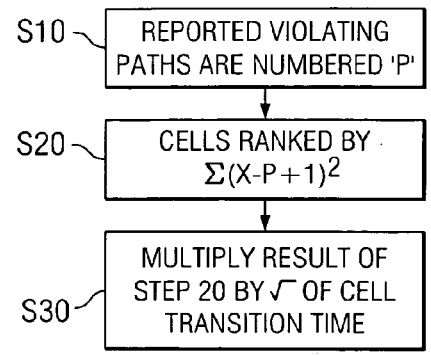
FIG. 3 is a flow chart showing a method in accordance with an embodiment of the present invention.

The ranking process ranks the referenced cells in order of the contribution of the cell to the overall timing miss and allocates the cell with a rank number as described above. In a preferred embodiment of the present invention the contribution of the cell to the timing miss is calculated as shown in FIG. 3. Firstly, in step 10 (S10) each reported violating path is numbered such that the path with the slowest path timing is allocated the number 'one', the path with the second slowest path timing is allocated the number 'two' and so on, up until the violating path having the shortest violating time is numbered n. It should be appreciated that if all the paths reported in step 1 of the method described in relation to FIG. 2 violate the maximum time, n will be equal to x. The number of each path is generally referred to as p.

In step 20 (S20), the rank of the cell is calculated using the following equation:

$$\Sigma(x-p+1)^2 \qquad \text{(Equation 1)}$$

where the algorithm is summed over each value of p on which a particular cell occurs. At step 30 (S30), the result of equation 1 is multiplied by the square root of the transition time of the cell. The rank is ordered by the lowest numerical value first and, as previously described, and the top predetermined number (y) cells are upgraded to HS cells.

For example, if a cell U1 occurs on the $1^{st}$ and $9^{th}$ reported violating paths out of 10 reported paths and has a transition time of 0.5 ns, the rank of cell U1 is:

$$\Sigma(A1 - p + 1)^2 * SQRT(0.5) = (10 - 1 + 1)^2 + (10 - 9 + 1)^2 * SQRT(0.5)$$
$$= 73.54$$

If another cell U2 occurs on the $4^{th}$, $5^{th}$ and $6^{th}$ ranked paths and has a transition time of 0.8 ns, the rank of cell U2 is:

$$(10-4+1)^2+(10-5+1)^2+(10-6+1)^2*SQRT(0.8)=98.39$$

Since the algorithm is repeated until the HS cell limit is exceeded, or the timing conditions are met, cells that are not upgraded in one pass may be upgraded in the next.

It will be appreciated by the skilled person that any similar ranking algorithm may be applied in alternative embodiments of the present invention and that the invention is not limited to the embodiment described above.

As cells are upgraded during each pass of the algorithm, the number of reported paths that violate the maximum time defined in step 2 will decrease and may decrease to a number less than x. If this occurs before the HS cell limit is exceeded and before the timing conditions are met, this may cause the process of upgrading cells to slow down significantly, since the number of paths reported to violate the maximum time limit has decreased.

This may be overcome by changing the number of paths STA is set to identify for each end point, i.e. the cell at which the path terminates. As previously stated, if one path is identified per end point and there is more than one path per endpoint, the path with the worst timing is identified. Increasing the number of paths reported for each end point by some factor may increase how many of the violating paths are reported in one pass of the algorithm. For example, if an endpoint has three different violating paths terminating at it and STA is set to identify one path for each endpoint only the worst of the three will be reported. If however STA is set to report three paths for each end point then all three violating paths will be identified and reported. Therefore increasing the number of paths reported for each endpoint may increase the total number of paths reported in each pass of the algorithm.

For example in order to prevent the process from slowing down, the number of paths identified for each end point may be doubled if the number of violating paths is less than the predetermined number (x) of paths reported. This condition may be included in the algorithm in the following manner:

increase no of paths per endpoint if limit reached if ($no_of_paths<$nworst_limit) then setenv NWORST 'expr 2\*$NWORST' endif (A3)

(See Appendix A)

The maximum time allowed for the timing of a path is fixed by the target performance of the design. Once no paths violate this time the performance is met and the algorithm stops.

Figure 4:
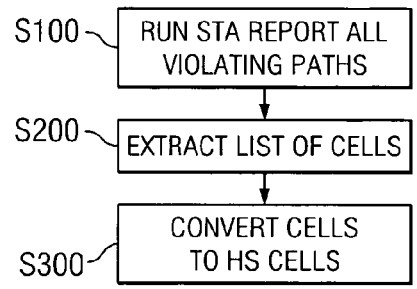
FIG. 4 is a flow chart showing a method in accordance with an alternative embodiment of the present invention.

In an alternative embodiment of the present invention, an algorithm that follows the steps shown in the flowchart of FIG. 4 may be used replace to LL cells with HS cells.

In step 100 (S100), a single set of STA results are produced that report all violating paths. This may be achieved by reporting timing through the output pins of each cell in the design.

In step 200 (S200), the cells on each of the violating paths are identified.

In step 300 (S300) the cells identified at step 200 are converted to HS cells.

Figure 5:
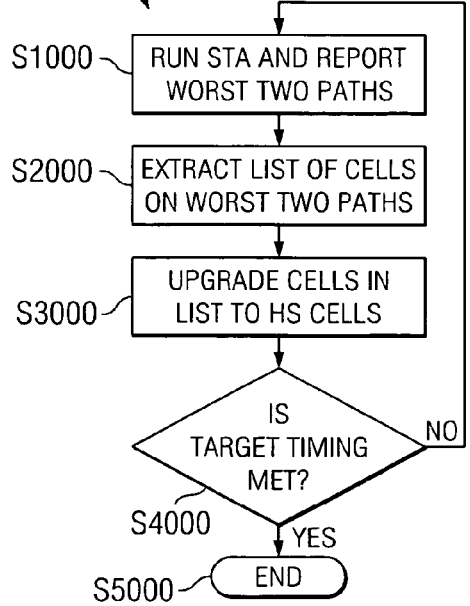
FIG. 5 is a flow chart showing a method in accordance with a further embodiment of the present invention.

In a further alternative embodiment of the present invention, an algorithm that follows the steps shown in the flow chart of FIG. 5 may be used to replace LL cells with HS cells.

In step 1000 (S1000) STA is performed and a predetermined number (z) of paths having the slowest timing paths are reported.

In step 2000 (S2000) the cells on the paths reported in step 1000 are identified.

In step 3000 (S3000) the identified cells are upgraded to HS cells.

In step 4000 (S4000) it is determined whether the timing target is met. If the timing target is met the process ends at step 5000 (S5000), otherwise the process returns to step 1000 and is repeated.

In some embodiments of the present invention the algorithms described above may be applied incrementally to a database that already includes a proportion of HS cells. Alternatively in other embodiments of the present invention all cells can initially be forced back, to LL cells before the algorithms are performed.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

Number of violating paths = 1073, from 13 startpoints to 793 endpoints.
　Worst slack on path group IR_STBUS: −1.36
　Worst slack on path group IR_C200: −0.23
　Worst slack on path group RR_STBUS: −1.15
　Worst slack on path group RR_C200: −1.01
　Worst slack on path group RO_STBUS: −0.17
　Worst slack on path group RO_C200: −0.13
　Worst slack on path group IO_STBUS: −0.05
　0 HS cells / 102622 LL cells. ( 0 % )
　Pass 2
　Number of violating paths = 622, from 20 startpoints to 526 endpoints.
　Worst slack on path group IR_STBUS: −0.41
　Worst slack on path group IR_C200: −0.07
　Worst slack on path group RR_STBUS: −0.54
　Worst slack on path group RR_C200: −0.45
　Worst slack on path group RO_STBUS: 0.25
　Worst slack on path group RO_C200: 0.41
　Worst slack on path group IO_STBUS: 0.12
　1477 HS cells / 101145 LL cells. ( 1 % )
　Pass 3
　Number of violating paths = 68, from 15 startpoints to 73 endpoints.
　Worst slack on path group IR_STBUS: −0.17
　Worst slack on path group IR_C200: 0.00
　Worst slack on path group RR_STBUS: −0.03
　Worst slack on path group RR_C200: −0.10
　Worst slack on path group RO_STBUS: 0.36
　Worst slack on path group RO_C200: 0.64
　Worst slack on path group IO_STBUS: 0.28
　2393 HS cells / 100229 LL cells ( 2 % )
　Pass 4
　Number of violating paths = 6, from 8 startpoints to 10 endpoints.
　Worst slack on path group IR_STBUS: 0.00
　Worst slack on path group IR_C200: 0.00
　Worst slack on path group RR_STBUS: 0.19
　Worst slack on path group RR_C200: −0.02
　Worst slack on path group RO_STBUS: 0.43
　Worst slack on path group RO_C200: 0.64
　Worst slack on path group IO_STBUS: 0.43
　2838 HS cells / 99784 LL cells ( 2 % )
　Pass 5
　Number of violating paths = 0, from 7 startpoints to 7 endpoints.
　Worst slack on path group IR_STBUS: 0.00
　Worst slack on path group IR_C200: 0.01
　Worst slack on path group RR_STBUS: 0.19
　Worst slack on path group RR_C200: 0.07
　Worst slack on path group RO_STBUS: 0.54
　Worst slack on path group RO_C200: 0.64
　Worst slack on path group IO_STBUS: 0.46
　2925 HS cells / 99697 LL cells ( 2 % )
Attachments
==========
hs_batch_script, awk_hs_cells

```
#:/bin/csh -f
# hs_batch_script
# set design name
setenv DNAME "stbus_ss_top"
# set path groups
setenv PATH_GROUPS "IR_STBUS IR_C200 RR_STBUS RR_C200 RO_STBUS RO_C200 IO_STBUS"
# set initial value for paths reported per endpoint
setenv NWORST 1
# set number of paths to report
setenv MAX_REP 500
# use LL or incremental LL re-starts from all LL cells, incremental changes
current netlist
set mode = "incremental"
# can skip initial PrimeTime run if already done
set skip_initial_pt = "false"
# limit the number of iterations
set passes = 10
# limit the number cell substitutions per pass
set cells_per_pass = $MAX_REP
# limit threshold for increasing the number of paths per endpoint
set nworst_limit = `expr $MAX_REP / 2`
# remove old temporary files
rm -f WORK/*
# create starting netlist
if ($mode == "LL") then
   cat DATA/$DNAME.v | sed -e "s/HS/LL/" > WORK/$DNANE.v
```

-continued

```
else
   cp DATA/$DNAME.v WORK
endif
echo "Beginning LL -> HS Optimisation " $mode " mode. " \
   | tee ll_to_hs.log
echo "" \
   | tee -a ll_to_hs.log
set i = 1
while (1 == 1) # loop
   echo "Pass" $i \
      | tee -a ll_to_hs.log
   # run initial STA if required
   if ($skip_initial_pt == "true" && $i == 1) then
      echo "Skipping primetime on first pass." \
         | tee -a ll_to_hs.log
   else
      cd PRIMETIME
      runPT_dspf case
      cd
   endif
   # process STA reports for violating paths
   foreach path_group ($PATH_GROUPS)
      cat PRIMETIME/reports/wc_dspf_functional/timing/max_$path_group.txt \
         | sed -e "/MET/q" > WORK/violating_worst_paths_$path_group.txt
   end
   # report statistics on current design
   set no_of_paths = 'cat WORK/violating_worst_paths*.txt | grep "VIOL" | wc -1'
   set startpoints = 'cat WORK/violating_worst_paths*.txt | grep Startpoint '
sort -u | wc -1'
   set endpoints = 'cat WORK/violating_worst_paths*.txt | grep Endpoint | sort
-u | wc -1'
   echo "Number of violating paths = "$no_of_paths", from "$startpoints"
startpoints to "$endpoints" endpoints:" \
      | tee -a ll_to_hs.log
   foreach path_group ($PATH_GROUPS)
      set wns = 'cat WORK/violating_worst_paths_$path_group.txt | sed -n -e
"/slack/p;/slack/q" | awk '{print $NF}''
      echo "Worst slack on path group "$path_group": "$wns \
         | tee -a ll_to_hs.log
   end
   set hs_count = 'grep HS WORK/$DNANE.v | wc -1'
   sec ll_count = 'grep LL WORK/$DNAME.v | wc -1'
   set all_count = 'expr $ll_count + $hs_count'
   set hs_pct = 'expr $hs_count \* 100 / $all_count'
   echo $hs_count "HS cells /" $ll_count "LL cells (" $hs_pct "% )" \
      | tee -a ll_to_hs.log
   # exit if no violations or iteration limit
   if ($no_of_paths == 0 || $i > $passes) then
      cat WORK/hs_cells_*.txt \
         | sort \
         | awk -f ../../scripts/.awk_gen_dc_script \
            > ll_to_hs_complete.tcl
      exit 0
   endif
   # increase no of paths per endpoint if limit reached
   if ($no_of_paths < $nworst_limit) then
      setenv NWORST 'expr 2 \* $NWORST'
   endif
   # create cell list for substitution for each path group
   foreach path_group ($PATH_GROUPS)
      # find all cells output pins in violating paths
      awk -f ../../scripts/.awk_add_path_no
WORK/violating_worst_paths_$path_group.txt SMAX_REP \
         | grep LL \
         | egrep '(/CO|/Z|/Q)' \
         | sort \
         > WORK/cells.txt
      # rank and sort cell list
      awk -f ../../scripts/.awk_hs_cells WORK/cells.txt \
         | sort +4 -5n \
         | tail -$cells_per_pass \
         > WORK/hs_cells_spath_group\_si.txt
   end
   # create dc_shell script to do all substitutions
   cat WORK/hs_cells_*_$i.txt \
      | sort \
      | awk -f ../../scripts/.awk_gen_dc_script \
      > DC/scripts/ll_to_hs.tcl
   cp WORK/$DNAME.v DC/import
```

```
# run dc_shell to implement substitutions
  cd DC
  ./runSynth ll_to_hs_run
  cd
  cp DC/output/$DNAME.v WORK
  # save scripts
  mv DC/scripts/ll_to_hs.tcl WORK/ll_to_hs_$i.tcl
  mv DC/logs/ll_to_hs_run.log WORK/ll_to_hs_run_$i.log
  # increment loop count
  set i = 'expr $i + 1'
end
  awk_hs_cells
BEGIN{
cell_name = "XXXX"}
{
# load initial cell
if (cell_name == "XXXX")
    {
    cell_name = $1
    count = 1
    cell_type = $2
    trans = $3
    incr = $4
    line = $7 * $7
    }
# every time cell name changes compute ranking and load next cell
if ($i != cell_name)
    {
    # cells score is sum of squares mutiplied by square root of transition
    rank = (line * sqrt(trans))
    # decompose cell type into function and drive
    len = length (cell_type)
    type_start = index(cell_type, "LL")
    type = substr (cell_type, 2, type_start − 2)
    drive = substr (cell_type, type_start, len − type_start)
    # generate hierarchical instance
    levels = split (cell_name, cell_root, "/")
    if (levels == 2)
       {
       instance = cell_root [1]
       reference = "TOP"
       }
    else
       {
       instance = cell_root[levels − 1]
       reference = cell_root[1]
       for (i = 2; i < levels − 1 ; i++)
          {
          reference = sprintf ("%s%s%s", reference, "/", cell_root[i])
          }
       }
    # replace LL with HS of equivalent drive
    new_drive = "void"
    if (drive == "LL"   ) {new_drive = "HS"    }
    if (drive == "LLP"  ) {new_drive = "HSP"   }
    if (drive == "LLX3" ) {new_drive = "HSX3"  }
    if (drive == "LLX4" ) {new_drive = "HSX4"  }
    if (drive == "LLX6" ) {new_drive = "HSX6"  }
    if (drive == "LLX8" ) {new_drive = "HSX8"  }
    if (drive == "LLX10") {new_drive = "HSX10" }
    if (drive == "LLX12") {new_drive = "HSX12" }
    if (drive == "LLX16") {new_drive = "HSX16" }
    # if valid substitution print output
    if (new_drive != "void")
       {
       print reference, instance, type, drive, rank, trans, incr, count, new_drive
       }
    # load new cell
    cell_name = $1
    count = 1
    cell_type = $2
    trans = $3
    incr = $4
    # initial rank is square of first line
    line = $7 * $7
    }
else
    {
    # same cell again add to rank
```

```
        count = count + 1
        # add square of next line
        line = line + ($7 * $7)
        }
}
```

The invention claimed is:

1. A method of replacing standard cells with high speed cells in a design of a circuit using a computer program, said circuit design comprising a plurality of high speed cells and a plurality of standard cells, said high speed cells and said standard cells being arranged to form a plurality of paths, said method comprising the steps of:

timing said plurality of paths;
  identifying cells occurring on paths for which timing targets are not met, the paths for which timing targets are not met belonging to a first set of paths; and
  upgrading at least one of said identified cells to a high speed cell;
  wherein the first set of paths is determined from a second set of paths, and the second set of paths is changed to include an increased number of paths if the number of the second set of paths for which timing targets are not met is less than a specified number of paths.

2. A method as claimed in claim 1, further comprising the step of determining the first set of paths.

3. A method according to claim 1 wherein said first set of paths is a set of paths that have slowest timings.

4. A method according to claim 1 wherein the specified number of paths comprises a predetermined number of paths.

5. A method as claimed in claim 1 wherein the first set of paths are ordered according to timing and allocated an order number.

6. A method as claimed in claim 1 wherein the cells identified as occurring on said set of paths for which timing targets are not met are ranked in order of a contribution of the cell to a timing of a path.

7. A method as claimed in claim 6 wherein the contribution of the cell to the timing of the path is calculated using at least one of:

an order number of each path the cell occurs on; and
  a transition time of the cell.

8. A method as claimed in claim 6 wherein a predetermined number of highest ranked cells are replaced with high speed cells.

9. A method as claimed in claim 1 wherein the first set of paths comprises paths that each begin at one of a plurality of inputs and terminate at one of a plurality of registers.

10. A method as claimed in claim 1 wherein the first set of paths comprises paths that each begin at one of a plurality of first registers and terminate at one of a plurality of second registers.

11. A method as claimed in claim 1 wherein the first set of paths comprises paths tat each begin at one of a plurality of registers and terminate at one of a plurality of outputs.

12. A method as claimed in claim 1 wherein the circuit design comprises a plurality of endpoints at which the plurality of paths terminate.

13. A method as claimed in claim 12 wherein the endpoints are cells.

14. A method as claimed in claim 12 wherein the second set of paths comprises one path per endpoint.

15. A method as claimed in claim 12 wherein the second set of paths comprises a plurality of paths per endpoint.

16. A method as claimed in claim 12 wherein the second set of paths is changed to comprise an increased number of paths per endpoint.

17. A method as claimed in claim 1 wherein the circuit is an integrated circuit.

18. A method as claimed in claim 17 wherein the integrated circuit is an application specific integrated circuit.

19. A computer program for replacing standard cells with high speed cells in a design of a circuit, said circuit design comprising a plurality of high speed coils and a plurality standard cells, said high speed cells and said standard cells being arranged to form a plurality of paths, said computer program arranged to carry out the steps of:

timing said plurality of paths;
  identifying cells occurring on paths for which timing targets are not met, the paths for which timing targets are not met belonging to a first set of paths; and
  upgrading at least one of said identified cells to a high speed cell;
  wherein the first set of paths is determined from a second set of paths, and the second set of paths is changed to include an increased number of paths if the number of second set of paths for which timing targets are not met is less than a specified number of paths.

20. A computer program as claimed in claim 19, further arranged to carry out the step of determining the first set of paths.

21. A computer program according to claim 19 wherein said first set of paths is a set of paths that have slowest timings.

22. A computer program according to claim 19 wherein the specified number of paths comprises a predetermined number of paths.

23. A computer program as claimed in claim 19 wherein the first set of paths are ordered according to timing and allocated an order number.

24. A computer program as claimed in claim 19 wherein the cells identified as occurring on said set of paths for which timing targets are not met are ranked in order of a contribution of the cell to a timing of a path.

25. A computer program as claimed in claim 24 wherein the contribution of the cell to the timing of the path is calculated using at least one of:

an order number of each path the cell occurs on; and
  a transition time of the cell.

26. A computer as claimed in claim 24 wherein a predetermined number of highest ranked cells are replaced with high speed cells.

27. A computer program as claimed in claim 19 wherein the first set of paths comprises pats tat each begin at one of a plurality of inputs and terminate at one of a plurality of registers.

28. A computer program as claimed in claim 19 wherein the first set of paths comprises paths that each begin at one of a plurality of first registers and terminate at one of a plurality of second registers.

29. A computer program as claimed in claim 19 wherein the first set of paths comprises paths that each begin at one of a plurality of registers and terminate at one of a plurality of outputs.

30. A computer program as claimed in claim 19 wherein the circuit design comprises a plurality of endpoints at which the plurality of paths terminate.

31. A computer program as claimed in claim 30 wherein the endpoints are cells.

32. A computer program as claimed in claim 30 wherein the second set of paths comprises one path per endpoint.

33. A computer program us claimed in claim 30 wherein the second set of paths comprises a plurality of paths par endpoint.

34. A computer program as claimed in claim 30 wherein the second set of paths is changed to comprise an increased number of paths per endpoint.

35. A computer program as claimed in claim 19 wherein the circuit is an integrated circuit.

36. A computer program as claimed in claim 35 wherein the integrated circuit is an application specific integrated circuit.

37. A method of replacing standard cells with high speed cells in a design of a circuit using a computer program, said circuit design comprising a plurality of high speed cells and a plurality of standard cells, said high speed cells and said standard cells being arranged to form a plurality of paths, said method comprising the steps of:

timing said plurality of paths;

identifying paths for which timing targets are not met, the paths for which timing targets are not met belonging to a first set of paths; and upgrading cells occurring on said identified pats to high speed cells;

wherein the first set of oaths is determined from a second set of paths, and the second set of paths is changed to include an increased number paths if the number of the second set of paths for which timing targets are not met is less than a specified number of paths.

38. A method as claimed in claim 37, wherein the circuit is an application specific integrated circuit

* * * * *

UNITED STATES PATENT AND TRADEMARK OFFICE
CERTIFICATE OF CORRECTION

PATENT NO.        : 7,017,131 B2                                        Page 1 of 1
APPLICATION NO.   : 10/614336
DATED             : March 21, 2006
INVENTOR(S)       : Paul Barnes It is certified that error appears in the above-identified patent and that said Letters Patent is hereby corrected as shown below:

Column 4, line 27, insert -- , -- after the term "cells";

Column 6, line 58, delete "," after the term "back";

Column 14, claim 27, line 65, delete "pats tat" and replace with -- paths that --;

Column 15, claim 33, line 17, delete "par" and replace with -- per --;

Column 16, claim 37, line 13, delete "pats" and replace with -- paths --;

Column 16, claim 37, line 15, delete "oaths" and replace with -- paths --;

Column 16, claim 37, line 17, insert -- of -- before the term "paths".

Signed and Sealed this

Seventeenth Day of October, 2006

JON W. DUDAS
*Director of the United States Patent and Trademark Office*